United States Patent [19]
Long

[11] Patent Number: 5,304,738
[45] Date of Patent: Apr. 19, 1994

[54] SYSTEM FOR PROTECTING LEADS OF A SEMICONDUCTOR CHIP PACKAGE DURING TESTING, BURN-IN AND HANDLING

[75] Inventor: Jon M. Long, Livermore, Calif.

[73] Assignee: VLSI Technology, Inc., San Jose, Calif.

[21] Appl. No.: 36,421

[22] Filed: Mar. 24, 1993

Related U.S. Application Data

[63] Continuation of Ser. No. 723,134, Jun. 28, 1991, Pat. No. 5,221,812.

[51] Int. Cl.⁵ .................... H01L 23/02; H01R 43/00
[52] U.S. Cl. ................................ 174/52.4; 257/787; 29/854; 29/855; 174/52.2
[58] Field of Search ............... 174/52.1, 52.2, 52.3, 174/52.4; 257/678, 687, 690, 692, 693, 694, 695, 696, 697, 701, 704, 787, 788, 790, 791, 792, 793, 794, 666, 671, 673, 674; 29/854, 855, 856, 841, 857, 858; 264/271.1, 272.11, 272.12

[56] References Cited

U.S. PATENT DOCUMENTS

| | | | |
|---|---|---|---|
| 3,219,748 | 11/1965 | Miller | 174/52.4 |
| 4,701,781 | 10/1987 | Sankhogowit | 174/52.4 |
| 4,801,561 | 1/1989 | Sankhogowit | 174/52.4 |
| 4,837,184 | 6/1989 | Lin et al. | 264/272.11 |
| 4,897,602 | 1/1990 | Lin et al. | 361/421 |
| 5,079,673 | 1/1992 | Kodai et al. | 361/400 |
| 5,221,812 | 6/1993 | Long | 174/52.4 |

FOREIGN PATENT DOCUMENTS 2310956 12/1990 Japan ................................ 257/673

Primary Examiner—Leo P. Picard
Assistant Examiner—Bot Ledynh
Attorney, Agent, or Firm—Majestic, Parsons, Siebert & Hsue

[57] ABSTRACT

After a semiconductor die is placed onto a leadframe and electrically connected to the die, the die and the ends of the leads adjacent to the die are encased in a packaged body. The exposed ends of the leads are trimmed so that the leads are of desired lengths for leadforming, or for connection to substrates or sockets. The ends of the leads are enclosed in a protective body, so that when the package is tested and handled, the protective body reduces undesirable bending of the leads. By trimming the leads before forming the protective body, the leadframe used need not be larger than those normally used.

8 Claims, 3 Drawing Sheets

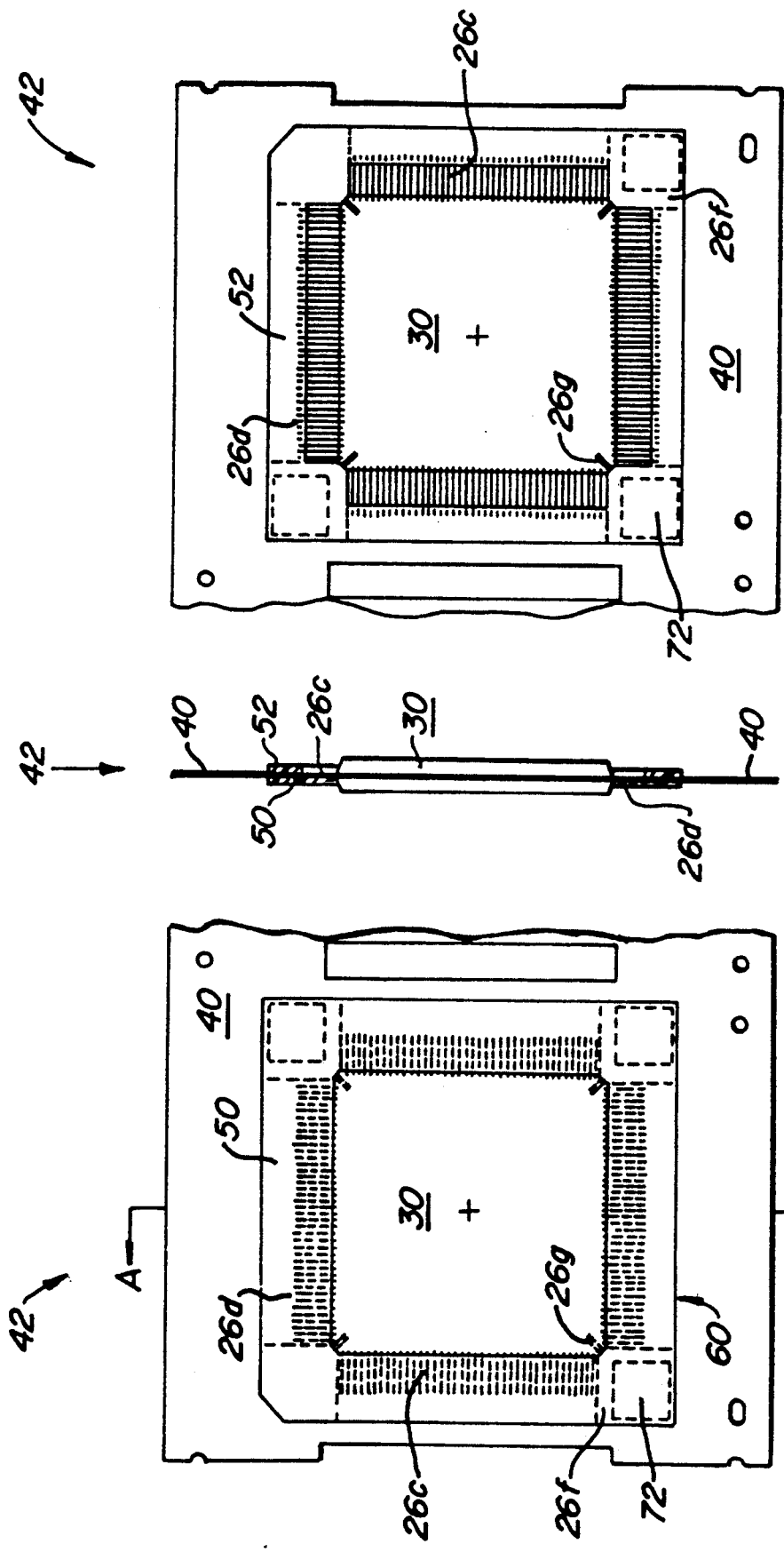

SYSTEM FOR PROTECTING LEADS OF A SEMICONDUCTOR CHIP PACKAGE DURING TESTING, BURN-IN AND HANDLING

This is a continuation of application Ser. No. 723,134 filed Jun. 28, 1991, now U.S. Pat. No. 5,221,812.

BACKGROUND OF THE INVENTION

This invention relates in general to electronic device packages and in particular, to a semiconductor chip package using a protective body to reduce lead bending during the testing and burn-in processes of the leads.

Typically, integrated circuits are housed in structures where the integrated circuit chip and inner portions of leads are surrounded or encapsulated by material forming the package body. The outer ends of the leads protrude from the package body and are attached and electrically connected by conventional methods such as soldering to a printed circuit (PC) board, a fixture or socket. With the development of denser and more complex circuitry on integrated circuit chips, there is relentless pressure to reduce the size of the package and/or increasing pin or lead counts. To accomplish such goals, thinner and more fragile leads have frequently been used. With the use of thinner and more fragile leads, lead bending becomes an even more significant problem than before in the semiconductor chip packaging technology.

After the semiconductor die is bonded to a leadframe and encapsulated, for some types of chip packages, the leads are bent into predetermined shapes in a step known as lead forming, so that the end portions of the leads are in proper locations for bonding to a substrate such as a PC board. In the case of surface mount packages, this usually means bending the leads so that the lead end portions are substantially coplanar, so that they are in position to be soldered to contacts on top of the PC board.

Before integrated circuit packages are shipped to customers, they must usually be first electrically tested for their electrical properties. Then they are subjected to high temperature and tested again for their electrical properties. Typically, the leads of the packages are first formed into proper shapes ready for connection to PC boards or other substrates before the packages are tested or burned-in. Testing procedures after the exposed outer ends of the leads outside the package body have been formed sometimes cause the outer ends of the leads to be bent. After testing, the packages are usually transferred to sockets and placed in ovens for the burn-in process. After the burn-in process, the packages are re-tested and transferred to trays or other containers suitable for shipment to customers. The formed leads are sometimes bent during the processes of transfer to the burn-in sockets and then to the shipment trays. When the outer ends of the leads are soldered to PC boards or other substrates, this mounting and soldering procedure normally requires the outer ends of the leads to be in proper positions. If lead bending causes the positions of the outer lead ends to deviate from such predetermined positions by greater than a given tolerance, the bent leads must first be corrected or the package must be discarded altogether. For this reason, it is important to avoid bending the leads during the testing or other handling procedures after the leads have been formed but before the packages are shipped to customers.

One solution to the above-described lead bending problem is to encapsulate portions of the outer leads in a carrier frame. One such technique is described by Lin et al. in U.S. Pat. No. 4,897,602. As described in Lin et al., such technique involves employing a copper foil tape with finger contacts that extend further out than that normally required for forming the outer lead ends, where the extended portion forms splayed out portions serving as probe ends for use during testing of the die inside the package. After the semiconductor die and the inner portions of the leads are encapsulated to form the chip package, a carrier frame is molded around and spaced from the periphery of the die or chip package to enclose the extended portions of the leads except for the probe ends. The probe ends are exposed within a slot in the frame or extend from the ends of the frame so that probe tips of testing equipment can be pressed thereon to test the die and its bonds. The stiff molded carrier frame disclosed by Lin et al. acts to support the probe ends of the lead fingers and protects and stiffens the foil tape for the testing operations and for shipping and handling purposes. When the package is ready to be mounted onto the PC board, the carrier frame and probe ends are sheared away and discarded and the remaining portions of the fingers are formed into leads to be interconnected to the PC board. Lin et al. proposed an improved package with carrier frame where a different and relatively lower quality and less expensive material is used for the carrier structure than for the package body to reduce the cost of the package. A package similar to the one described above is also described in U.S. Pat. No. 4,837,184 to Lin et al.

The above-described packages with carrier frames are disadvantageous in that the leads have not been formed when they are shipped to customers. This means that, before customers can mount and connect the package to a substrate such as a printed circuit board, the carrier frame must be sheared off together with the probe ends and the remaining outer lead ends appropriately formed before they can be soldered onto PC boards. Thus customers must perform the lead forming procedure before the packages can be mounted and the package-carrier assembly of Lin et al. is therefore cumbersome for customers to use. Furthermore, lead forming equipment is expensive and can cost up to $100,000 for equipment appropriate for forming leads using thicker leadframes. Because lead forming equipment is expensive, many customers, and in particular smaller companies, may not have the appropriate equipment for forming the leads. Furthermore, since the carrier frame and the probe ends are sheared off in the above-described devices before the packages can be mounted, the carrier frame and probe ends must be significantly larger than the package itself so that the package-carrier assembly occupies much more space than a package without a carrier frame. This increases the bulk and therefore the cost of shipment to customers. Since a portion of the leadframe is sheared off and discarded, fewer packages will be obtained per unit area of the leadframe, which also increases the cost of the packages. Moreover, the package processing equipment may need to be altered to accommodate larger leadframes and longer leads. It is therefore desirable to provide a semiconductor package-carrier assembly which is more compact, more efficient in the use of materials and less expensive to ship.

SUMMARY OF THE INVENTION

This invention is based on the observation that by first trimming the leads to predetermined lengths suitable for lead forming, or for connection to substrates such as PC boards or sockets, and then forming a protective body to protect the leads during testing and subsequent handling procedures, the above described difficulties are avoided. The leads and leadframe employed may simply be of the same size as those normally used. As noted above, in Lin et al.'s design, since the carrier frame and probe leads are sheared off before the packages can be mounted, the carrier frame must be formed from a leadframe which is significantly larger than the leadframes normally used and the leads, in order to provide the probed ends which are subsequently sheared off, must be much longer than those normally used.

One aspect of the invention is directed towards a method for packaging a semiconductor die. The method comprises providing a leadframe. The leadframe has supporting rails and leads with proximal ends close to the die for connection to the die, other ends and intermediate portions connecting the proximal ends and other ends. The method further comprises placing the die onto the leadframe and electrically connecting the proximal ends of the leads to the die, encasing the die and the proximal ends in a package body and trimming the other ends of the leads to form distal ends so that the leads are of desired lengths for lead forming, or for connection to substrates or sockets. The method further comprises enclosing the distal ends in the protective body, so that when the package is tested and handled, the protective body reduces undesirable bending of the leads.

Another aspect of the invention is directed towards a semiconductor package assembly comprising a semiconductor die and a leadframe supporting the die. The leadframe has supporting rails and leads with proximal ends close to the die for connection to the die, distal ends and intermediate portions connecting the proximal ends and distal ends. The leads are of desired lengths for lead forming, or for connection to substrates or sockets. The assembly further comprises means electrically connecting the proximal ends of the leads to the die, a package body encasing the die and the proximal ends and a protective body enclosing the distal ends so that when the package is tested and handled, the protective body reduces undesirable bending of the leads.

BRIEF DESCRIPTION OF THE DRAWINGS

FIG. 9 is a top view of the package with the protective body formed by the process illustrated in FIG. 4.

FIG. 10 is a cross-sectional view of the package in FIG. 9 along the line A—A in FIG. 9.

FIG. 11 is a bottom view of the package with protective body of FIG. 9.

DETAILED DESCRIPTION OF THE PREFERRED EMBODIMENT

Figure 1:
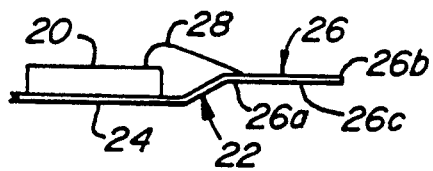
FIGS. 1, 2 and 3 are schematic views illustrating a conventional method for electrically connecting the leads of a leadframe to a semiconductor die supported by the leadframe, molding a package body and trimming the leads.

FIG. 1 is a schematic view illustrating how a semiconductor die is supported onto a leadframe and electrically connected to the leads of the leadframe. As shown in FIG. 1, semiconductor die 20 is supported on a die attach pad 24 of a leadframe 22. Leadframe 22 includes leads 26 each having a proximal end 26a close to or adjacent to die 20 and other end 26b. The proximal end of each lead is connected to the die by a bonding wire 28. The proximal end 26a and other end 26b are connected by an intermediate portion 26c.

Figure 2:
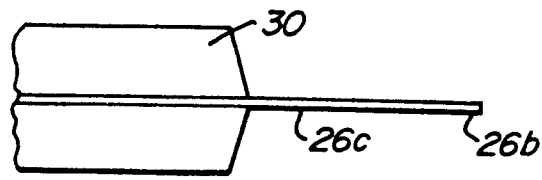

After the bonding wires are in place, a conventional molding process such as injection or transfer molding is used to form a package body 30 as shown in FIG. 2, encasing die 20, pad 24, bonding wires 28, and the proximal ends 26a of the leads (not shown in FIG. 2), leaving intermediate portions 26c and other ends 26b exposed, as shown in FIG. 2. It is known to those skilled in the art that die attach pad 24 and leads 26 are supported by rails during the processes illustrated in FIGS. 1 and 2. For simplicity, these rails have not been shown in FIGS. 1 and 2.

Figure 3:
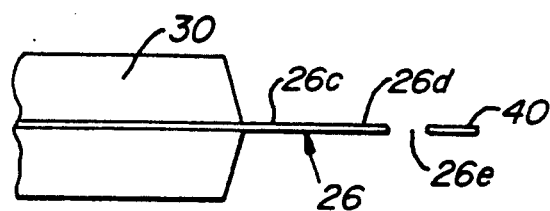

As also known to those skilled in the art, leads 26 are frequently longer than desired for lead forming or for connection to PC boards or sockets when the package body 30 is molded. Tie bars are also frequently present to hold the leads 26 in place during the molding process for body 30 and to assist in the molding process. FIG. 3 is a schematic view illustrating a conventional lead trimming process where the tie bars and the excess portions of the leads at the other end 26b have been trimmed so that the length of the leads are of desired predetermined magnitude suitable for lead forming. Where the type of package is such that the leads need not be bent before they are suitable for connection to substrates or sockets, the leads should be of the appropriate lengths for such connections. Thus as shown in FIG. 3, the leads have been shortened in the trimming process, typically by cutting off portions of the leads at ends 26b, leaving the intermediate portions 26c and distal ends 26d ready for lead forming or for connection to substrates or sockets. Also shown in FIG. 3 is a rail 40 which is connected to the package 30 by four connection bars described in more detail below in reference to and as shown in FIGS. 9–11.

Figure 4:
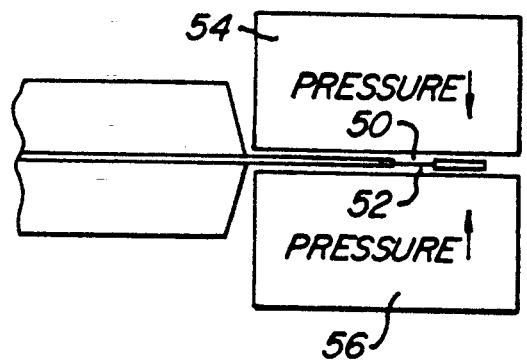
FIG. 4 is a schematic view illustrating the process for forming a protective body to protect the leads during subsequent testing and burn in procedures.
Figure 5:
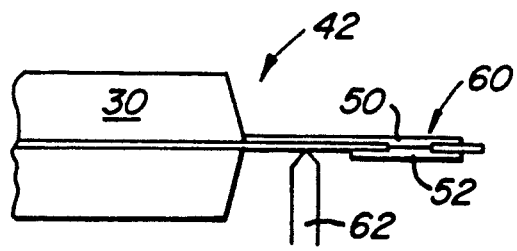
FIG. 5 is a schematic view illustrating the testing and burn in of the package.

FIG. 4 is a schematic view illustrating the formation of a protective body enclosing at least the distal ends 26d to provide support for the leads during the subsequent testing and burn-in process. In the preferred embodiment as illustrated FIG. 4, this is achieved by pressing two sheets of material together under pressure and at high temperature in a lamination process. As shown in FIGS. 3–5, there are holes in the leadframe, such as hole 26e, shown in FIG. 3. When sheets 50, 52 are pressed together by blocks 54 and 56 under high pressure and temperature, the two sheets 50 and 52 become attached to the leadframe and to each other through the holes 26e to provide a sturdy protective body 60 as shown in FIG. 5. As shown in FIGS. 4 and 5, in the preferred embodiment the top sheet 50 provides support for the entire exposed lengths on one side of the leads including intermediate portions 26c and distal ends 26d. Sheet 52, on the other hand, covers only the distal ends 26d but leave the intermediate portions 26c exposed so that the leads are accessible for testing purposes.

FIG. 5 is a schematic view illustrating the testing and burn-in process of the package. As shown in FIG. 5, the bottom surfaces of the intermediate portions 26c of the leads 26 are contacted by probes 62 for the purpose of testing the electrical properties of the die 20 and of the whole package. During the testing, probe ends 62 will apply forces to leads 26. Protective body 60 will provide support for the leads to reduce any undesirable bending of the leads caused by the forces applied by probe ends 62.

At the time while the package is being tested electrically or at a different time, the whole package is heated in a burn-in process. If the package and leadframe are subjected to a burn-in process separate and apart from the testing, protective body 60 also protects the leads and reduces any undesirable bending of the leads when the package and leadframe are handled during such and other subsequent processes. Protective body 60 and therefore sheets 50 and 52 are preferably made of a material which is soluble by a solvent. To reduce the amount of organic waste created by the process, it is preferable that the material used be soluble in water. One such material is polyvinyl alcohol, although other types of water-soluble plastic may be used instead.

Figure 7:
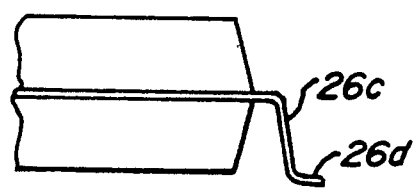
FIG. 7 is a schematic view illustrating the excising of the supporting rail of the leadframe and the forming of the leads.
Figure 8:
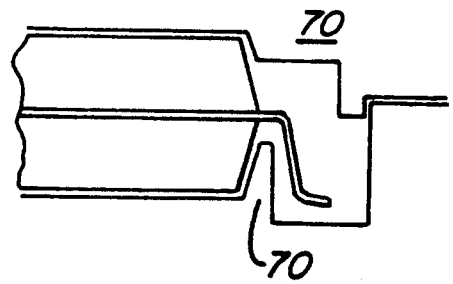
FIG. 8 is a schematic view illustrating the loading of the finished package onto a tray ready for shipping.

FIG. 7 illustrates condition of the package after the rail 40 has been excised and the intermediate portions 26c of the leads have been bent in order to form the leads into a shape suitable for connection to a PC board or socket or other connecting structures. As shown in FIG. 8, the package of FIG. 7 may then be loaded into trays 70 ready for shipment to customers.

Figure 6:
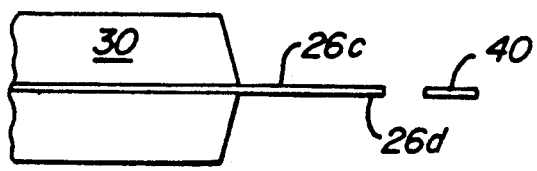
FIG. 6 is a schematic view illustrating the condition of the package after the protective body is removed.

The structure 42 resulting from the process in FIG. 4 is shown in FIGS. 5 and 6, said structure including leadframe 26, package body 30, and protective body 60. This structure 42 is illustrated in more detail in FIGS. 9, 10, and 11. FIG. 9 is a top view of structure 42. FIG. 10 is a cross-sectional view of structure 42 along the line A—A in FIG. 9. FIG. 11 is a bottom view of the structure 42.

For simplicity, identical components are identified by the same numerals in the figures of this application. As shown in FIG. 9, the tie bars and excess portions of leads at ends 26b have already been trimmed (and therefore not shown) to leave distal ends 26d so that the leads are all of the desired lengths for lead forming or for connection to substrate such as PC boards or sockets or other types of connection structure without further trimming. This is done before sheets 50 and 52 are laminated to form protective body 60. As shown in FIG. 9, in the structure 42, package body 30 is connected to rail 40 only by bars 26f and 26g. As shown in FIG. 9, for each package, three holes 72 are provided in the leadframe at three of the corners of package body 30 to increase the area through which sheets 50, 52 may contact, so that when the two sheets are pressed together as shown in FIG. 4, the two sheets will contact and be attached to each other through larger areas to form a more sturdy protective body 60. At the left upper corner of package body 30, no hole is provided; instead, the entire leadframe portion of the leadframe in this area is intact, thereby not creating bars similar to bars 26f at the three other corners. This is necessary to permit the injection of plastic for forming body 30, in embodiments where body 30 is formed by injection or transfer molding.

Figure 12:
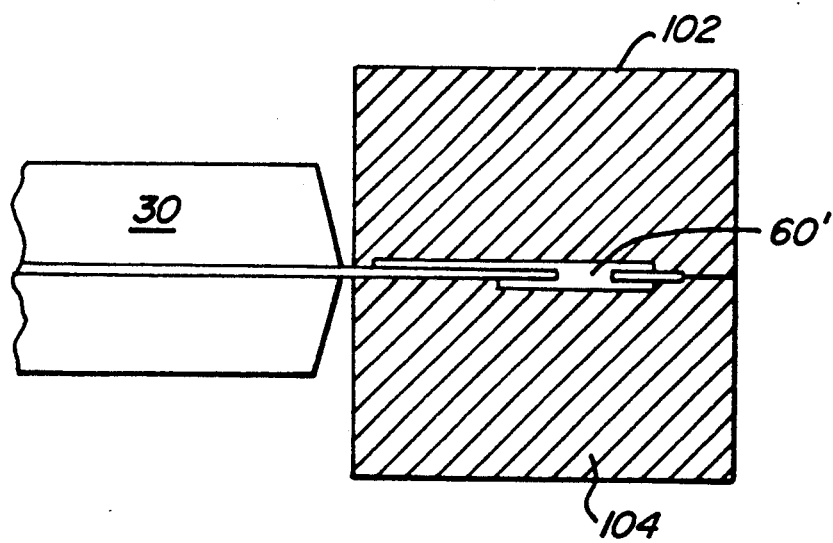
FIG. 12 is a schematic view showing a molding process for forming a protective body to protect the leads in order to illustrate a alternative method for making the body.

When rail 40 is to be excised from package body 30, the connection between bars 26f and 26g are severed at the corners of the body 30. The intermediate portions 26c of the leads are then bent in a conventional lead forming operation to obtain the shape shown in FIG. 7. In this or other shapes (not shown), the leads are ready to be soldered to PC boards or sockets or other connection structures. If the leads do not need to be formed before they are connected to connection structures such as PC boards, other substrates or sockets, then the semiconductor package is ready to be shipped after rails 40 have been excised since the leads are already of proper lengths for this purpose. FIG. 12 is a schematic view showing a molding process for forming the protective body 60. As shown in FIG. 6, two blocks 102, 104 fit together, one above and one below intermediate portions 26c of the leads, leaving a space 60' in between of the proper shape for forming the protective body 60. A plastic material is then provided by a known process such as injection or transfer molding to form a unitary body 60 (not shown in FIG. 12) between blocks 102, 104.

From the above, it is evident that the purpose of the invention is achieved. By trimming the leads and tie bars before the protective body is formed, the leads need not be longer than those normally used and the leadframe need not be larger than those normally used without the protective body. In this manner, no changes to the normal packaging operation is required, in contrast to the technique of Lin et al described above. Thus, after the leads have been trimmed, for leadframes whose thicknesses are less than about 0.15 mm, the lengths of the leads may be less than about 5.8 mm. Where the leadframe used is of the tape-automated bonding variety, where the leadframe forms a conductive layer on a substrate (not shown in the figures), so that the conductive layer has a thickness less than about 0.035 mm, the lengths of the trimmed leads may be less than about 2.5 mm.

The finished package as shown in FIG. 7 may be loaded onto trays as shown in FIG. 8 for shipment to customers. For customers who prefer to do their own lead forming, the structure 42 may be shipped instead. In such event, at the customers' facility, the protective body 60 is removed by water, rails 40 excised and leads 26 formed as shown in FIGS. 6 and 7.

The invention has been described by reference to the preferred embodiment It will be understood, however, that various modifications may be made. While in the preferred embodiment, the entire lengths of the exposed portions of the leads outside of package body 30 are shown supported by body 60 on one side, it will be understood that it may be adequate to support the leads only at the distal ends; such configuration is within the scope of the invention. The step of enclosing the distal ends in the protective body is described as a lamination process in the preferred embodiment. It will be understood that other types of processes, including molding processes, may be used within the scope of the invention. The scope of the invention is to be limited only by the appended claims.

What is claimed is:

1. A method for packaging a semiconductor die, comprising:

providing a leadframe, said leadframe having supporting rails and leads with proximal ends close to the die for connection to the die, other ends and intermediate portions connecting the proximal ends and other ends;

placing the die onto the leadframe and electrically connecting the proximal ends of the leads to the die;

enclosing the other distal ends in a protective body; and thereafter, removing the protective body without removing any portion of the leadframe.

2. The method of claim 1, further comprising trimming the other ends of the leads to form distal ends so that the leads are of desired lengths for lead forming, or for connection to substrates or sockets.

3. The method of claim 2, wherein said trimming step occurs before the distal ends are enclosed in the enclosing step.

4. The method of claim 1, said removing step including dissolving the protective body by a solvent.

5. The method of claim 4, wherein said solvent is water.

6. The method of claim 1, further comprising the step of removing the rails.

7. The method of claim 6, further comprising the step of bending the leads into predetermined shapes suitable for connection to a substrate or socket.

8. The method of claim 1, further comprising encasing the die and the proxial ends in a package body.

* * * * *